United States Patent
Binder et al.

(10) Patent No.: US 9,676,010 B2
(45) Date of Patent: Jun. 13, 2017

(54) INSTALLATION AND PROCESS FOR THE TREATMENT OF METALLIC PIECES BY A PLASMA REACTOR

(71) Applicants: Universidade Federal De Santa Catarina (UFSC), Florianopolis—Sc (BR); Whirlpool S.A., São Paulo—Sp (BR)

(72) Inventors: Roberto Binder, Joinville (BR); Aloisio Nelmo Klein, Florianopolis (BR); Cristiano Binder, Florianopolis (BR); Gisele Hammes, Florianopolis (BR)

(73) Assignees: Universidade Federal De Santa Catarina (UFSC), Florianopolis—Sc (BR); Whirlpool S.A., São Paulo—Sp (BR)

( * ) Notice: Subject to any disclaimer, the term of this patent is extended or adjusted under 35 U.S.C. 154(b) by 0 days.

(21) Appl. No.: 14/904,743

(22) PCT Filed: Jul. 15, 2014

(86) PCT No.: PCT/BR2014/000237
§ 371 (c)(1),
(2) Date: Jan. 13, 2016

(87) PCT Pub. No.: WO2015/006844
PCT Pub. Date: Jan. 22, 2015

(65) Prior Publication Data
US 2016/0151809 A1 Jun. 2, 2016

(30) Foreign Application Priority Data
Jul. 15, 2013 (BR) ..................... BR1020130180173

(51) Int. Cl.
*C23F 1/00* (2006.01)
*B08B 7/00* (2006.01)
(Continued)

(52) U.S. Cl.
CPC ............ *B08B 7/0035* (2013.01); *B22F 3/003* (2013.01); *B22F 3/24* (2013.01);
(Continued)

(58) Field of Classification Search
CPC .......... B08B 7/0035; B22F 3/24; B22F 3/003; H01L 21/67109; H01J 37/32009; H01J 37/3244; H01J 47/32522
(Continued)

(56) References Cited

U.S. PATENT DOCUMENTS

| 5,332,557 A | 7/1994 | Sahoda et al. |
| 2002/0108712 A1 | 8/2002 | Obuchi et al. |

(Continued)

FOREIGN PATENT DOCUMENTS

| WO | 2009149526 A1 | 12/2009 |
| WO | 2013062778 A1 | 5/2013 |

OTHER PUBLICATIONS

International Search Report, dated Oct. 29, 2014, International Application No. PCT/BR2014/000237, International Filing Date, Jul. 15, 2014.

*Primary Examiner* — Duy Deo
*Assistant Examiner* — Maki Angadi
(74) *Attorney, Agent, or Firm* — Dinsmore & Shohl LLP

(57) ABSTRACT

The plasma reactor comprises a reaction chamber (23) connectable to a source of ionizable gases (25) and to a heating device (80), said reactor (10) being subjected to the phases of heating (A), cleaning (L) and/or surface treatment (S), cooling (R), unloading (D) and loading (C) of metallic pieces (1). The installation comprises: at least two reactors
(Continued)

(10), each being selectively and alternately connected to: the same source of ionizable gases (25); the same vacuum source (60); the same electrical energy source (50); and to the same heating device (80), the latter being displaceable between operative positions, in each of which surrounding laterally and superiorly a respective reactor (10), while the latter is in its heating phase (A) and cleaning phase (L) and/or in the surface treatment phase (S) of the metallic pieces (1).

18 Claims, 7 Drawing Sheets

(51) Int. Cl.
*H01J 37/32* (2006.01)
*H01L 21/67* (2006.01)
*B22F 3/00* (2006.01)
*B22F 3/24* (2006.01)

(52) U.S. Cl.
CPC .... *H01J 37/32009* (2013.01); *H01J 37/3244* (2013.01); *H01J 37/32522* (2013.01); *H01J 37/32834* (2013.01); *H01J 37/32889* (2013.01); *H01J 37/32899* (2013.01); *H01L 21/6719* (2013.01); *H01L 21/67109* (2013.01); *H01L 21/67173* (2013.01); *B22F 2003/241* (2013.01); *B22F 2003/248* (2013.01); *H01J 2237/335* (2013.01)

(58) Field of Classification Search
USPC ...... 134/1.1, 2, 19; 216/59, 67, 75; 118/663, 118/723; 156/345.26
See application file for complete search history.

(56) References Cited

U.S. PATENT DOCUMENTS

| | | |
|---|---|---|
| 2009/0206056 A1 | 8/2009 | Xu et al. |
| 2013/0104996 A1* | 5/2013 | Oh .................. F16K 11/00 137/2 |

* cited by examiner

TO>TI

TO=TI

T0<TI

INSTALLATION AND PROCESS FOR THE TREATMENT OF METALLIC PIECES BY A PLASMA REACTOR

CROSS-REFERENCE TO RELATED APPLICATIONS

This application is the U.S. National Phase of PCT/BR2014/000237 filed Jul. 15, 2014, which claims priority of Brazilian Patent Application 10 2013 018017 3 filed Jul. 15, 2013.

FIELD OF THE INVENTION

The present invention refers to an installation and to a process for allowing the treatment of metallic pieces, particularly porous metallic pieces obtained from powder metallurgy, said treatment comprising a cleaning phase with dissociation and removal of oil and other organic and inorganic contaminants existing on the surface or in the pores of metallic pieces and also, optionally, a phase of thermochemically treating the surface of said metallic pieces, which operations are effected in a plasma reactive environment and, preferably, in the interior of the same reactor.

BACKGROUND OF THE INVENTION

In most of the cases, the pieces produced by powder metallurgy need to be calibrated after the sintering step due to the dimensional variations that occur during sintering. Lubricant oil is used in the calibration to reduce friction and wear of the machine tools, as well as to facilitate extraction of the pieces from the calibration matrix. Lubricant oil is likewise usually used for storing sintered pieces and pieces produced by other manufacturing techniques. For example, refrigerant oil is also used for machining metallic pieces.

Aiming at improving the properties of the finished pieces, such as wear resistance, corrosion resistance and fatigue resistance, there are often used surface thermochemical treatments, such as nitriding, cementation, carbonitriding, etc. In order to effect these thermochemical treatments, the presence of oil on the surface and in the pores of the pieces is prejudicial, especially when the thermochemical processing is effected via plasma.

During plasma nitriding, the oil retained in the pores and on the surface of the pieces produces instabilities in the electrical discharge, contamination of the reactor, inadequate formation of the superficial layers formed (for example, by nitrates) and contamination with carbon of the material submitted to treatment by means of an inefficient cleaning. Thus, the oil must be completely removed before the thermochemical treatments of surface hardening.

In some known treating methods, the operations of cleaning and thermochemically treating the surfaces are carried out in two separate steps in distinct equipment, which requires a very long processing time, typically 20 hours, leading to low productivity and high cost.

With the purpose of obtaining a complete removal of the oil and other organic and inorganic contaminants from the metallic pieces, and also simplifying and abbreviating a subsequent phase of surface thermochemical treatment of said pieces in the same thermal cycle, there was proposed the process of surface cleaning and treatment object of Brazilian patent application PI-0105593-3, of the same applicant, according to which the pieces to be cleaned are positioned inside the plasma reactor and connected to an anode of the latter, the cathode of said reactor being connected to a negative potential. The pieces are surrounded by an ionized gas, so-called plasma, generated by an electric discharge. The electrons provoke an electronic bombardment on the pieces connected to the reactor anode. While the heat generated by the plasma, by the collision of fast ions and neutral atoms against the cathode is usually sufficient to provide vaporization of the molecularly dissociated oil, without requiring relevant changes in the plasma parameters more adequate to catalyze the reactions of interest in each cleaning phase, the heat generated by the plasma may, in many cases, not be sufficient to maintain the processing temperature required for carrying out a subsequent surface treatment on the cleaned pieces, thus being necessary to provide a resistive heating external to the reactor. Furthermore, the setting of the intensity of the electrical discharge in order to provide the temperature levels required in the subsequent surface treatment phase may cause electrical arcs in the reaction environment, causing surface damages on the pieces and contamination due to carbon deposits on the surface of the pieces, impairing further thermochemical treatments.

From the above, there were proposed the process and the plasma reactor object of the patent application PI0803774-4, also of the same applicant, describing and claiming a solution which allows to obtain, inside the reactor, homogeneous and even elevated temperatures as a function of the desired surface treatment, independently from the parameters of the electrical discharge for generating the plasma, which are more adequate to catalyze the aimed reactions in each case and without leading to the formation of electric arcs in the reaction environment.

The process and reactor proposed in the patent application PI0803774-4 allow the operations of cleaning and subsequent surface treatment of the pieces to be carried out in the same reactor, the temperature thereof being controlled by a preferably resistive external heating, allowing for a cleaning by molecular dissociation by gaseous plasma and vaporization and exhaustion of the dissociated contaminants, the interior of the plasma reactor being maintained at temperatures higher than the condensation temperature of said contaminants.

However, the phases of heating and operating the reactor, both in the cleaning operation and in the surface treatment operation, present a time span usually quite inferior to the total time span of the phases of loading and unloading the pieces and of cooling the reactor for removing or unloading the pieces. Even when carrying out a surface treatment phase after the cleaning phase, the total time span of the heating, cleaning and surface treatment will still be inferior to the total time span of the loading, unloading and cooling phases, mainly due to the cooling time if the latter is carried out without the help of an accelerated cooling system for the reactor and the reaction chamber thereof. When using an accelerated cooling system, it may be obtained a total time of loading, unloading and cooling approximately equal to the total time of heating and of operation, including at least one of the phases of cleaning and surface treatment.

Thus, the heating device and the systems for feeding ionizing gases, vacuum production and ionization, remain inoperative during the time of duration of the progressive cooling of the reactor, added of the total duration time of the loading and unloading phases of the pieces. Upon completion of the new load in the reactor, already previously cooled and unloaded, the heating device is re-activated to heat the interior of the reactor, keeping the latter in the desired temperature conditions, while also activating the systems for feeding ionizing gases, vacuum production and ionization, for carrying out at least one of the operations of cleaning and surface treatment.

The use of a heating device for each reactor presents, therefore, the drawback of keeping the heating device and the systems for feeding ionizing gases, vacuum production and ionization inoperative for a time which may correspond: to a fraction of the total heating and operation time of the reactor; to a time approximately equal to the total heating and operation time of the reactor; or also to a multiple of said total heating and operation time.

Besides the productivity loss, represented by the times of loading and unloading the pieces and of cooling the reactor, the heating device remains deactivated and cooling during the time in which it is inactive, waiting for the cooling of the reactor and for a new load of pieces in the latter, for then being activated again in order to start a new heating phase of the reactor. As mentioned above, the inactivity time of the reactor may be somewhat inferior, approximately equal or greater than the total time of heating and operation of the reactor, in order to carry out the cleaning, the surface treatment or also both operations in sequence.

It should be observed that, during the time in which the heating device remains inoperative, the systems: for feeding ionizing gases, for vacuum production and for ionization also remain inoperative, executing nothing that can be considered productive, despite the high cost they represent in an installation, in order to carry out the operations pf cleaning and/or of surface treatment of metallic pieces.

SUMMARY OF THE INVENTION

As a result of the drawbacks mentioned above in relation to the productivity limitation resulting from the inactivity time of the heating device and of the systems for feeding ionizing gases, vacuum production and ionization, during every complete operational cycle of the reactor, it is an object of the present invention to provide an installation and a process for the treatment of metallic pieces by gaseous plasma, under temperatures generated and controlled in a totally independent manner of the plasma generation parameters, without leading to the formation of electric arcs in the reaction environment and further reducing or eliminating the time in which the heating device and the systems for feeding ionizing gases, vacuum production and ionization remain inactive during a complete operational cycle of the reactor.

These and other objects are achieved with an installation for the treatment of metallic pieces by a plasma reactor of the type comprising a metallic housing defining, internally, a reaction chamber provided with: a support; an anode-cathode system connectable to an electrical energy source; an inlet connectable to a source of ionizable gases; an outlet of gaseous charge exhaustion connectable to a vacuum source; and a heating device to heat the reaction chamber, said reactor being subjected to the phases of heating, cleaning and/or surface treatment, cooling, unloading and loading of metallic pieces.

The installation comprises: at least two reactors, each having, selectively and alternately: the inlet thereof connected to the same source of ionizable gases; the outlet thereof connected to the same vacuum source; and the anode-cathode system thereof connected to the same electrical energy source, the heating device being displaceable between operative positions, in each of which it surrounds, laterally and superiorly, a respective reactor of the installation, while the latter remains in the phases of heating and cleaning and/or surface treatment of the metallic pieces.

The process object of the invention uses a plasma reactor such as defined above for the installation and comprises the steps of: carrying out a phase of loading metallic pieces in a first reactor; subjecting the first reactor to a heating phase by means of a um heating device selectively positioned around the first reactor, while its reaction chamber is simultaneously fed with a load of ionizing gases provided by a source of ionizing gases and subjected to an exhaustion of the gas load by the vacuum source and to the electrical discharges provided by the electrical energy source, in order to carry out, in an operation time, at least one of the operations of cleaning and surface treatment of the metallic pieces; displacing the heating device away from the first reactor and then positioning said heating device over the other reactor, already subjected to a phase of loading new metallic pieces, subjecting said other reactor to a heating phase, by means of the heating device, while its reaction chamber is simultaneously fed with a load of ionizing gases provided by the source of ionizing gases and subjected to an exhaustion of gas load by the vacuum source and to electrical discharges provided by the electrical energy source; and subjecting the first reactor to the phases of cooling, unloading and loading, in an inoperative time, preparing said first reactor to receive again the heating device, after finishing the operations of cleaning and/or surface treatment in the other reactor.

The cooling system may be designed to provide a cooling time which, added to the unloading and loading times of the reactor, achieves a total duration which corresponds to at least about half, or to the same value, or even to a multiple of the total time of feeding and operation of the reactor, allowing the heating device and the systems for feeding ionizing gases, for vacuum production and for ionization to be applied to at least one other reactor, at least while the first reactor is in at least one of the phases of cooling, unloading and loading.

BRIEF DESCRIPTION OF THE DRAWINGS

The invention will be described below, with reference to the attached drawings, given by way of example of one embodiment of the invention and in which.

DESCRIPTION OF THE INVENTION

Figure 1:
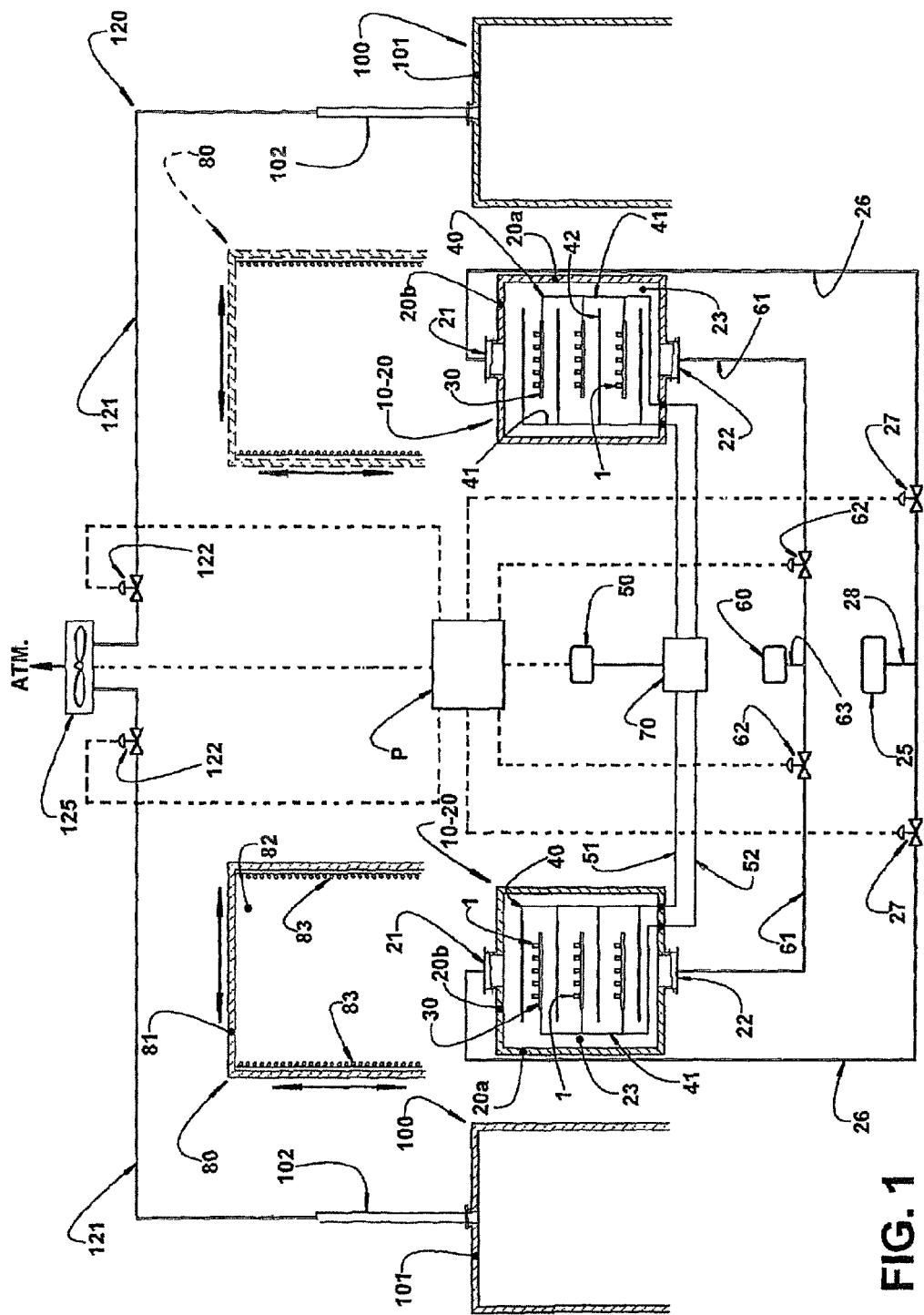
FIG. 1 represents, schematically, a flow diagram of a possible configuration for the installation of the invention, illustrating two reactors, each carrying in its interior a support frame supporting the metallic pieces to be treated.

As mentioned above and as illustrated in the appended drawings, the invention relates to a process and to an installation for treating metallic pieces 1 using at least two plasma reactors 10, each comprising a metallic casing 20 having an inlet 21 of ionizable gaseous charge and an outlet 22, of gaseous charge exhaustion, said metallic casing 20 defining, internally, a reaction chamber 23 inside which is usually positioned a support 30 for the metallic pieces 1.

The metallic casing 20 of each reactor 10 is preferably formed in refractory steel (as, for example stainless steel AISI 310 or 309), and the support 30 in refractory steel (as, for example stainless steel AISI 310 or 309), but other type of material can be used, depending on the adequate process temperatures.

The metallic casing 20 of each reactor 10 presents a prismatic shape, for example a cylinder, having wall extensions 20a which, in the cylindrical shape, comprises a surrounding circular wall and an upper end wall 20b.

Each metallic casing 20 may be inferiorly open in order to be removably and hermetically seated and locked on a base structure B in which are suitably mounted component parts operatively associated with the reactors 10 and which will be described throughout the present disclosure.

Inside the reaction chamber 23 of each reactor 10 is further provided an anode-cathode system 40 which is selectively connectable to an electrical energy source 50, preferably single and external to the reactors 10, the inlet 21 of the reaction chamber 23 being selectively connectable to a source of ionizable gases 25, also preferably single, and being the outlet 22 hermetically coupled to a vacuum source 60, also positioned external to the reactors 10 and which may be operatively associated, alternately, with each of the reactors 10 of the installation.

In the illustrated embodiment, the installation presents only two reactors 10, each being assembled on a respective base structure B directly fixed to the floor or to a single installation platform.

It may also be provided an additional base structure (not illustrated), for example positioned between the two reactors 10, in order to receive, onto itself, one of the reactors 10 upon the need for some repair or maintenance.

In said configuration, each of the two reactors 10 have the inlet 21 an the outlet 22 of its reaction chamber 23 respectively connectable to the source of ionizable gases 25 by means of conduits 26, and to the vacuum source 60 by means of respective ducts 61.

Each of the conduits 26 is provided with a control valve 27, usually an electromagnetic valve, to allow the selective feeding of ionizable gases to each of the reactors 10 upon operation thereof, from the source of ionizable gases 25 which feeds the control valves 27 by a common conduit 28. The source of ionizable gases 25 may be defined by a battery of bottles (not illustrated) containing the gas necessary for the process.

In a similar manner, each of the ducts 61 is provided with a shut off valve 62, usually electromagnetic driven, the two shut off valves 62 being maintained in fluid communication with the vacuum source 60 by means of a common duct 63.

The anode-cathode system 40 of each of the reactors 10 have the same electrode 41 electrically coupled to the support 30 and conductive elements 42 coupled to the other electrode 41 of the anode-cathode system 40.

The anode-cathode system 40 has the electrodes 41 thereof defined by the anode and by the cathode of said system. During the cleaning operation, the electrode 41 which defines the anode, is coupled to the support 30, said electrode 41 being grounded, while the other electrode 41, which defines the cathode, is electrically coupled to the electrical energy source 50 by means of a switch system 70 which allows to reverse the polarity between the anode and the cathode, in such way that the metallic pieces 1 which, during the cleaning operation with the dissociation of oil and contaminants need to be connected to the anode, are connected to the cathode for a subsequent plasma thermochemical surface treatment phase.

The switch system 70 is designed to provide not only the polarity inversion between the anode and the cathode, upon changing from one of the operations of cleaning L and surface treatment S to another of said operations to be carried out inside the same reactor 10, as well as to produce the necessary ionizing electrical discharge inside the respective reaction chamber 23, by means of respective electrical conductors 51, 52.

Each reactor 10 of the installation is built to be selectively surrounded, laterally and superiorly, by a heating device 80 mounted external to the reactor 10, that is, externally to the metallic casing 20 thereof, in order to heat the latter and the interior of the reaction chamber 23, for example, producing thermal radiation from the metallic casing 20 to the interior of the reaction chamber 23.

The heating device 80 comprises an outer shell 81, laterally and superiorly surrounding the former and which is usually formed in carbon steel coated by a suitable thermal insulating means (aluminate and silicate fibers, for example). The outer shell 81 defines a heating chamber 82 containing and affixing the heating device 80 and which is selectively positioned around one and the other of the reactors 10 of the installation.

The heating device 80 may be built in different manners such as, for example, by at least one resistor 83 to be taken to thermal contact with the metallic casing 20, inside the heating chamber 82, when the heating device 80 is positioned around one or the other of the reactors 10 of the installation.

The heating device 80 is displaceable between an inoperative position, away from the reactors 10, and an operative position in which it laterally and superiorly surrounds one of the reactors 10 of the installation.

The displacement of the heating device 80 between its operational positions may be carried out by different elevation and translatory means for cargo in general. However, considering the interest in an efficient and of increased productivity installation, it is convenient that the elevation and translatory means ET be of simple construction and of safe operation and specifically designed to execute the displacement required for the heating device 80.

In the illustrated construction, the elevation and translatory means ET is defined by a car 90 in the form of a structural frame displaceable on a pair of rails 92 located between the two reactors 10 and carrying an elevation device 91 in which is mounted the heating device 80, in order to allow the latter to be vertically displaced between an operative lowered position, in which it is positioned around a respective reactor 10 (not illustrated) and a raised position displaced upward from the level in which are located the upper ends of the reactors 10 of the installation, as illustrated in FIG. 1. In the raised position, the heating device 80 may be displaced, together with the car 90, to be positioned in vertical alignment over either of the reactors 10 and then lowered to surround the latter during the heating phase to carry out the cleaning and surface treatment operations.

The displacement of the car 90 and the vertical displacement of the elevation device 91 may be carried out by the manual or automated driving of known actuating means (not illustrated), usually electrically powered and commanded by a control panel P, which may have its operation automated in different levels. The control panel P is operatively coupled to the control valve 27 and shut off valve 62 and also to the switch system 70 and to the driving means of the car 90 and of the elevation device 91, in order to allow that the operational command instructions of the installation are transmitted to said devices, allowing the desired operation of the installation.

Thus, a single heating device 80, a single source of ionizable gases 25, a single vacuum source 60 and a single electrical energy source 50 may be used, in a practically continuous manner, or even with reduced inactivity time, minimizing thermal and productivity losses, by positioning the heating device 80 around one of the reactors 10, when the latter is in conditions of being heated and operating in the cleaning and/or surface treatment phases, while the other reactor 10 or the other reactors 10, if provided, are in their phases of cooling or unloading the already treated pieces or also in the phase of loading a new batch of pieces to be treated.

In order for the single heating device 80 may operate alternately around one or the other reactor 10, the reactors 10 of the installation are alternately and selectively connected to the source of ionizable gases 25, to the vacuum source 60 and to the electrical energy source 50, by means of manifolds for fluid and electric energy transmission, as already described above and illustrated in FIG. 1.

Figure 2:
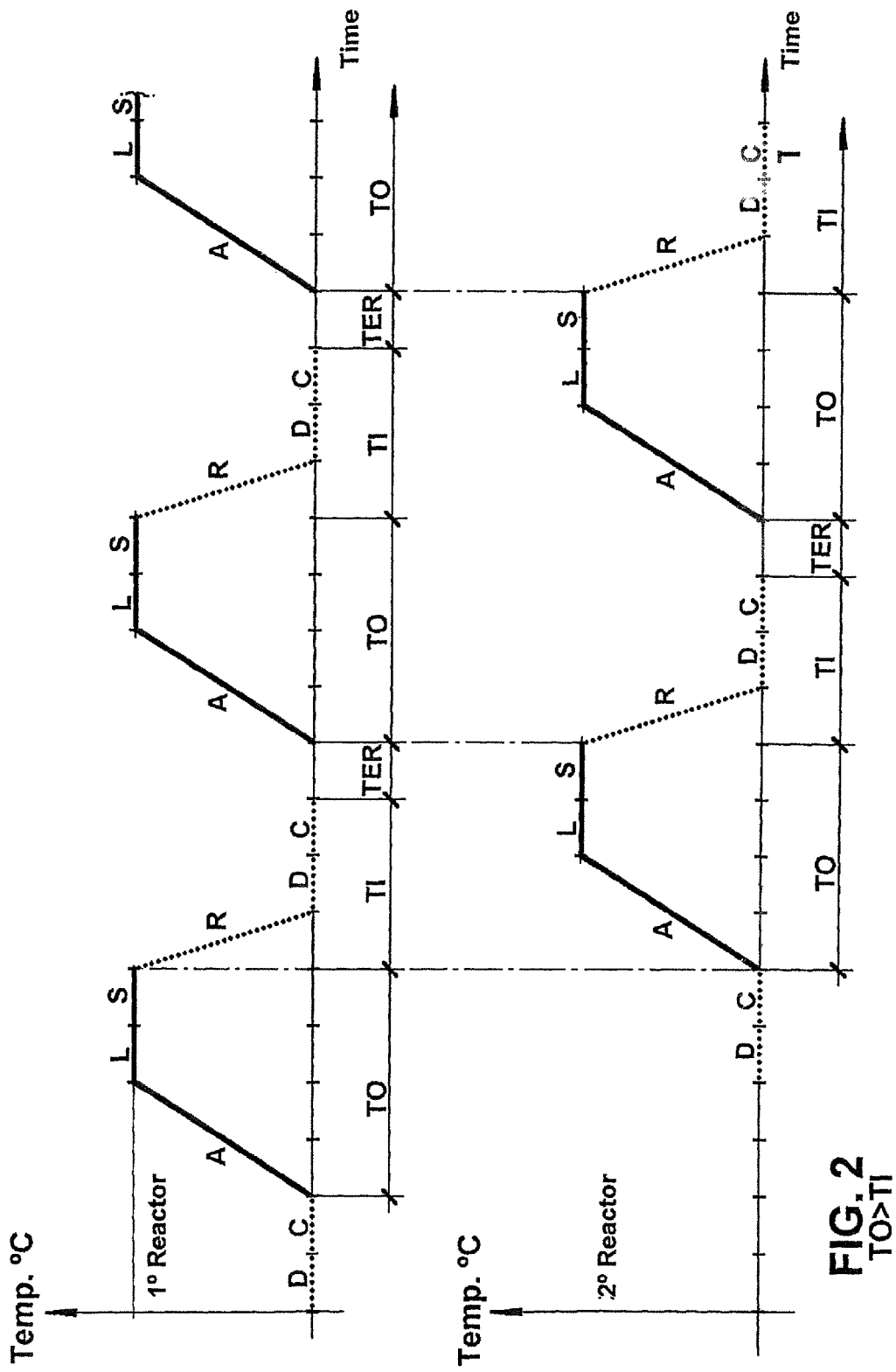
FIG. 2 represents a graph illustrating the time relation between the different phases of each operational cycle of two reactors to be selectively and alternately heated by a single heating device, in a condition in which the inactivity time of the heating device represents a fraction of the time in which it remains active, heating the reactor.
Figure 3:
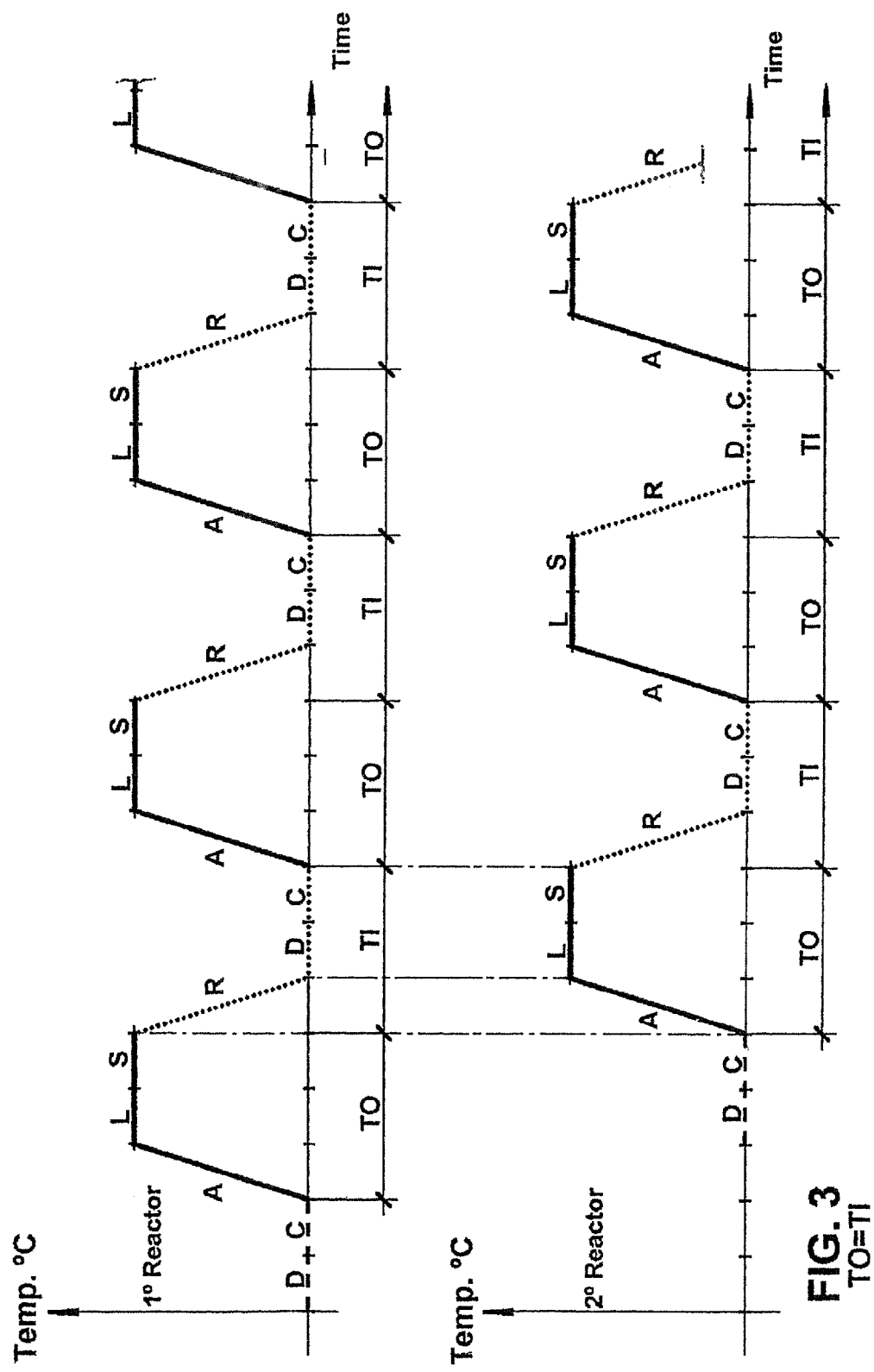
FIG. 3 represents a graph illustrating the time relation between the different phases of each operational cycle of two reactors to be selectively and alternately heated by a single heating device, in a condition in which the inactivity time of the heating device is equal to the time in which it remains active, heating the reactor.
Figure 4:
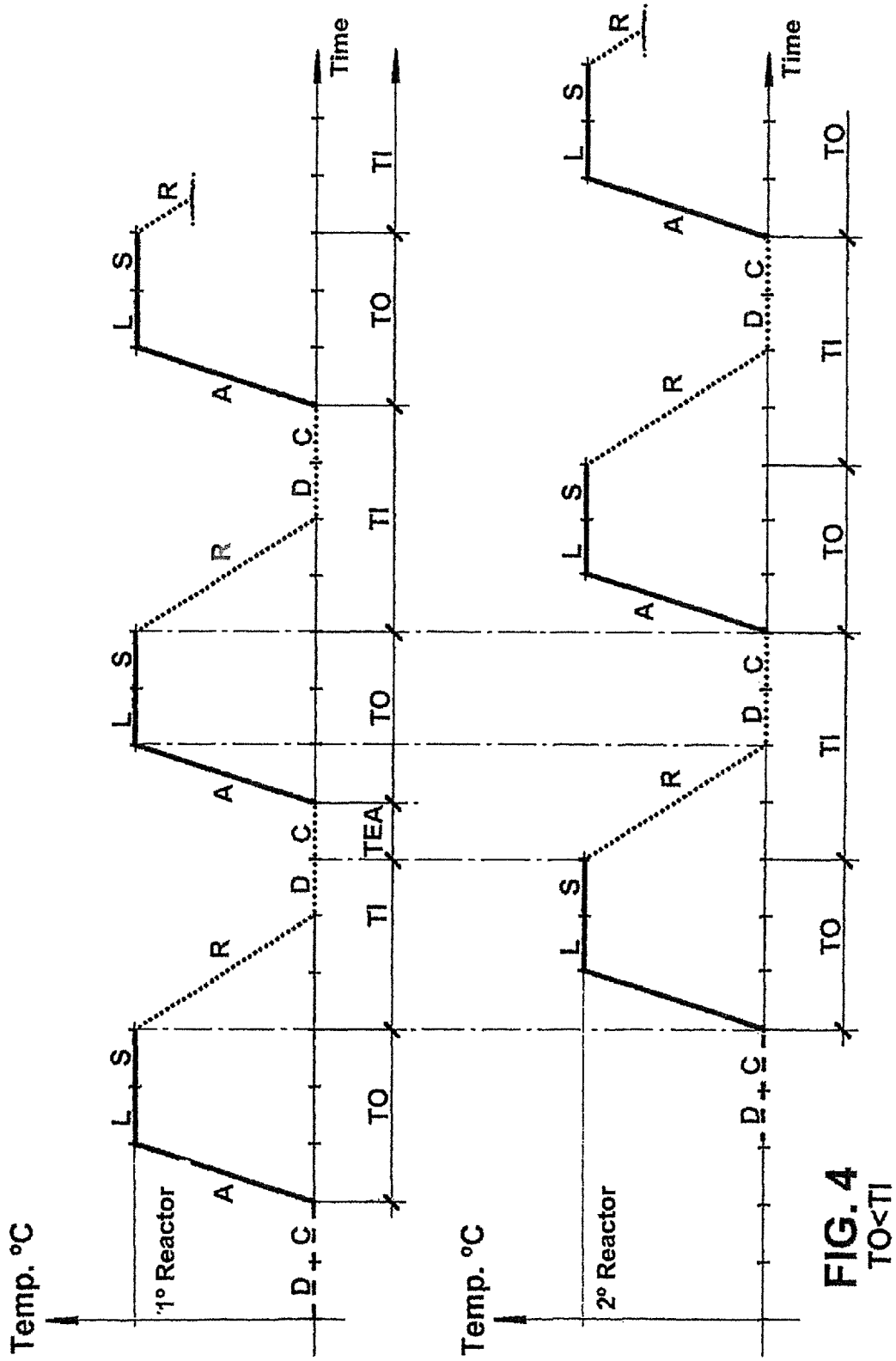
FIG. 4 represents a graph illustrating the time relation between the different phases of each operational cycle of two reactors to be selectively and alternately heated by a single heating device, in a condition in which the inactivity time of the heating device is a multiple of the time in which it remains active, heating the reactor.

With the installation proposed by the present invention, the process for the treatment of metallic pieces may be carried out with increased productivity, by means of the following exemplary steps, schematically illustrated in FIGS. 2, 3 and 4, which represent different relations between the sum of the times of the heating phase A and cleaning phase L and/or surface treatment phase S of a reactor 10, and the sum of the times of phases of cooling R, unloading D and loading C of the reactor 10.

In the beginning of the operation with a first reactor 10, the latter is subjected to the loading phase C with the heating device 80 positioned above this first reactor 10. Upon finishing the load phase C of the first reactor 10, the heating device 80 is displaced downwards, by the elevation device 91, to surround the first reactor 10 and start the heating phase A of the latter, while the reaction chamber 23 thereof is fed with a load of ionizing gases provided by the source of ionizable gases 25 and directed by the respective control valve 27.

As the temperature of the reaction chamber 23 is increased by the heating device 80 to the values required for at least one of the cleaning and surface treatment operations, the control panel P allows the production, from the electrical energy source 50, of electrical discharges inside the reaction chamber 23, causing the ionization of the gases and the formation of plasma. During the cleaning and surface treatment operations, the reaction chamber 23 of the first reactor 10 is subjected to the exhaustion, from its interior, of the gas load and of the contaminants in the gas state.

Upon finishing the cleaning and/or surface treatment operations, the vacuum source 60, the source of ionizable gases 25 and the electrical energy source 50 are disconnected from the first reactor 10, by command from the control panel P, and the heating device 80 is raised by the elevation device 91 and displaced, in this raised condition, to be positioned around another reactor 10 of the installation, already subjected to a loading phase C, while the first reactor 10 starts its cooling phase R to be then subjected to the unloading phase D and to the loading phase C of a new batch of metallic pieces 1.

As illustrated in FIG. 2, when the operational time TO (sum of the times of the heating phase A and of at least one of the phases of cleaning L and surface treatment S) is greater than the inoperative time TI (sum of the times of the phases of cooling R, unloading D and loading C) and lesser than twice the inoperative time TI, upon completion of the operations of cleaning L and/or of surface treatment S of the other reactor 10, the first reactor 10 will not have finished yet one or more of its phases of cooling R, unloading D and loading C. Thus, the heating device 80 is maintained in an operative position, surrounding a respective first reactor 10 during the heating phase A and the cleaning phase L, and/or the surface treatment phase S, for a time superior to the sum of the times in which the other reactor 10 of the installation takes to complete its phases of cooling R, unloading D and loading C, however less than twice said sum, the difference between the time in the operative position and said sum defining a reactor waiting time TER in which said other reactor 10 finishes its loading phase C before the first reactor 10 finishes its cleaning phase L and/or surface treatment phase S.

In such case, the heating device 80 is still being used during the cleaning phase L and/or surface treatment phase S in the other reactor 10, already with the first reactor 10 loaded and waiting, for a reactor waiting time TER, the clearing of the heating device 80 and of the remaining equipment shared with the other reactor 10.

Although in the condition of FIG. 2 the use of another reactor 10 does not allow the practically continuous use of the two reactors 10, the provision of the other reactor 10 allows the intense use of the heating device and of the shared equipment, defined by the vacuum source 60, the source of ionizing gases 25 and the electric energy source 50, as well as a greater or smaller increase in productivity, with a reduced loss of thermal energy of the heating device 80. The relation between the operative time TO and the inoperative time TI, as a function of the characteristics of the equipment used and of the operations to be carried out thereby may result in a relatively reduced reactor waiting time in relation to the possible benefits of increase in productivity.

When the operative time TO is equal or approximately equal to the inoperative time TI, the use of two reactors 10 allows the heating device 80 and the shared equipment to operate in a reactor 10, while the other reactor 10 is being cooled, unloaded and loaded, as illustrated in FIG. 3. In this case, there is practically no waiting time applied to the two reactors 10, to the heating device 80 and to the shared equipment.

However, as illustrated in FIG. 4, it may occur that the operative time TO, defined solely by one of the cleaning phase L and surface treatment phase S, or even by both phases, is lower than the inoperative time TI, as a result of the heating speed, of the reaction times and of a lower cooling speed of the reactors 10 and/or its phases of unloading D and loading C.

Considering that the reaction times may vary as a function of the characteristics and of the types of operations to be carried out (cleaning and/or surface treatment and types and quantities of pieces), in each of these types of operations demanded from the installation, there may be made adjustments in the cooling time and in the heating speed.

In the situation illustrated in FIG. 4, upon completion of the operations of cleaning L and/or surface treatment S of the other reactor 10, the first reactor 10 will still not have finished one or more of its phases of cooling R, unloading D and loading C. In this case, the heating device 80 and the shared equipment will be cleared from the other reactor 10, but may not be used in the first reactor 10 while the latter is not prepared with a new load of pieces to receive the heating device 80 and be operatively associated with the shared equipment of the installation. Thus, the heating device 80 and the shared equipment have to wait, for a heater waiting time TEA, until the end of the loading in the first reactor 10 so as to be used.

In such case, there will be a certain energy loss and also a productivity loss in relation to the operational capacity of both the heating device and the shared equipment.

Depending on the duration of the heater waiting time TEA, it may become advantageous to use another additional reactor 10 (third reactor, for example), allowing that the waiting time is transformed from a heater waiting time TEA to a reactor waiting time TER, as already described in the exemplary condition in FIG. 2.

It may further occur that the operative time TO corresponds to half of the inoperative time TI, in which case the use of three reactors 10 with a single set of shared equipment, including the heating device 80, allows reducing practically to zero the reactor waiting time TER and the heater waiting time TEA.

Thus, in order to obtain an intensive use of the entire installation, with no reactor waiting time TER and no heater waiting time TEA, and also with the equipment designed to provide an inoperative time TI of the reactor equal to N times the operative time TO, N being defined by an integer equal to or greater than 1, there should be provided N+1 reactors 10.

One of the time parameters which may be controlled in the installation is the time of the cooling phase R. In the illustrated construction, the cooling time is defined by the operation of a cooling device 100 which is selectively applied to a reactor 10 of the installation upon finishing the cleaning phase L and/or surface treatment phase S in said reactor 10. Due to the relatively reduced cost of the cooling device 100 proposed in the present invention, one cooling device 100 is used for each reactor 10.

Each cooling device 100 comprises a tubular housing 101, metallic and generally cylindrical, inferiorly open, superiorly closed and provided with an exhaustion conduit 102 to be connected to an exhaustion system 120, provided with suction ducts 121 to be each coupled to one of the exhaustion conduits 102 of a respective cooling device 100, said suction ducts 121 being connected by means of respective exhaustion valves 122 (see FIG. 1) to a shared exhaustion device 125, usually in the form of a fan, which is able to produce, selectively and alternately by means of the opening of one of the exhaustion valves 122 and closing of the other, an upward air flow, through the interior of the cooling device 100.

The exhaustion valves 122, usually electromagnetic, may be manually or automatically driven from the control panel P as a function of the alternative operational conditions of the components of the installation.

Each tubular housing 101 is mounted in a movable frame 110, to slide on a pair of rails 111, in order to allow each cooling device 100 to be displaced between an inoperative position away from the respective reactor 10 and an operative position, laterally and superiorly surrounding said reactor 10.

In the illustrated embodiment, each of the cooling devices 100 is located in the same alignment in relation to the two reactors 10, external to the latter and maintained in a level corresponding to that of the respective reactor 10. Each cooling device 100 has the tubular housing 101 thereof comprising a pair of cylindrical lateral wall portions, vertically articulated in order to allow the opening of the tubular housing 101, upon the horizontal displacement of the cooling device 100 in the direction of the respective reactor 10, in order to laterally and superiorly surround the latter during the cooling phase R.

However, it should be understood that the displacement of each cooling device 100 between the inoperative and operative positions may be carried out in different manners, and it is also possible to use a single cooling device 100 to alternately operate on each of the reactors 10 of the installation.

Figure 5:
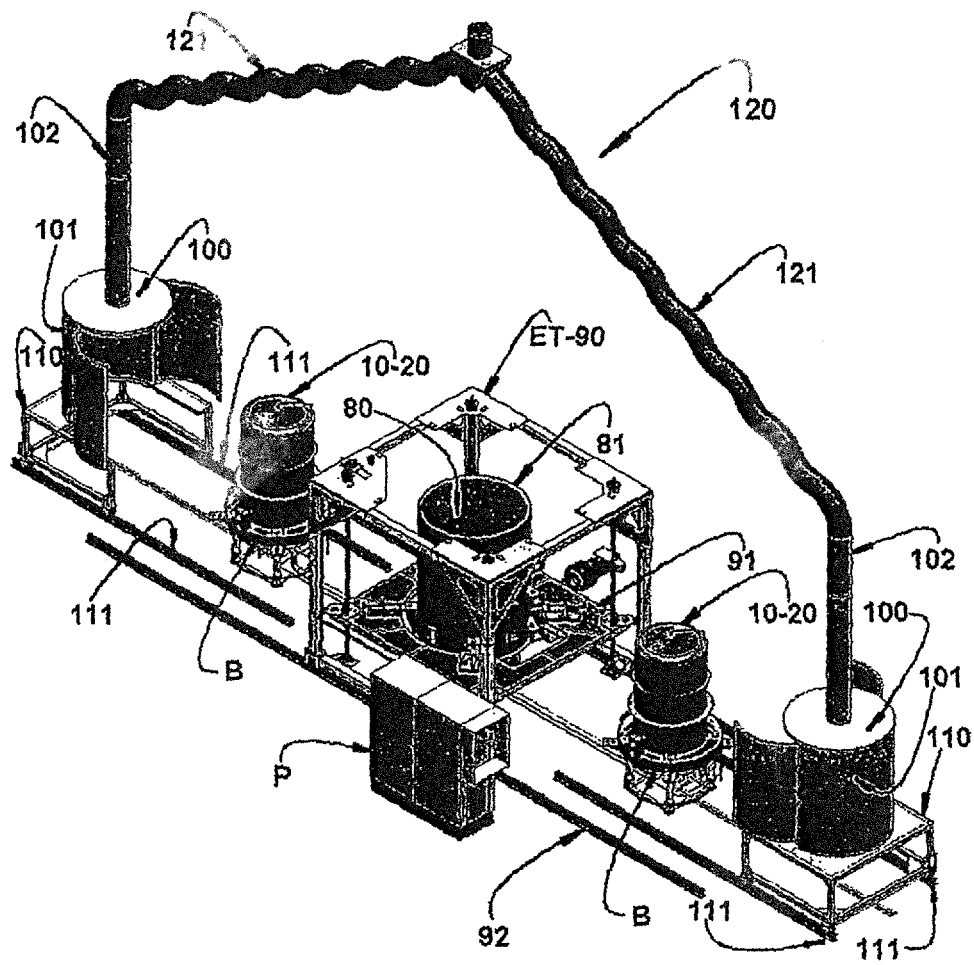
FIG. 5 represents a top perspective view, somewhat schematic, of an installation built according to the invention and using two reactors, one heating device and two cooling devices having their hot air outlets connected to a common exhaustion device by means of suction ducts.
Figure 6:
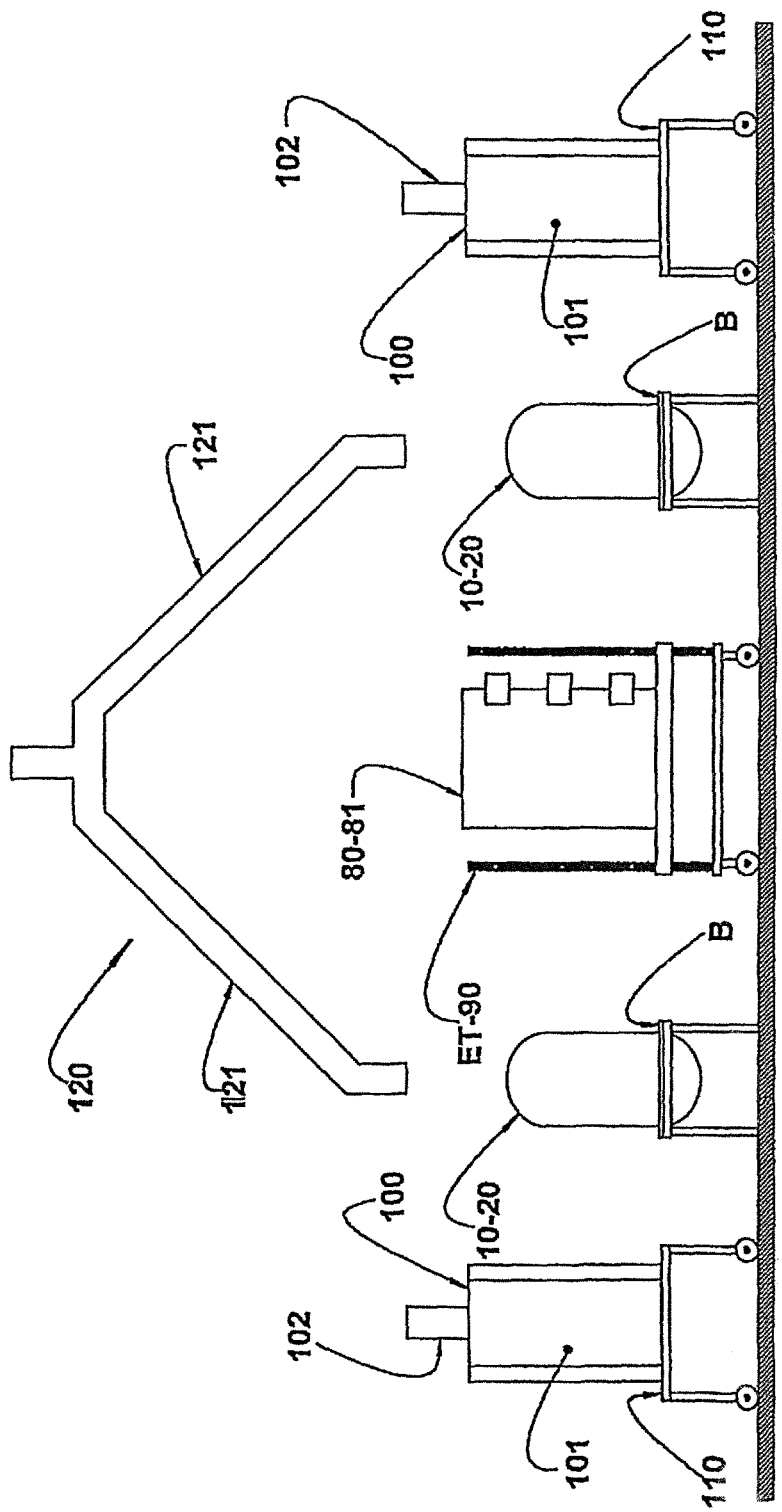
FIG. 6 represents a side schematic view of the installation of FIG. 5, further illustrating, in a simplified manner, a fixed construction for the suction ducts, having their inlet ends positioned over each respective reactor.
Figure 7:
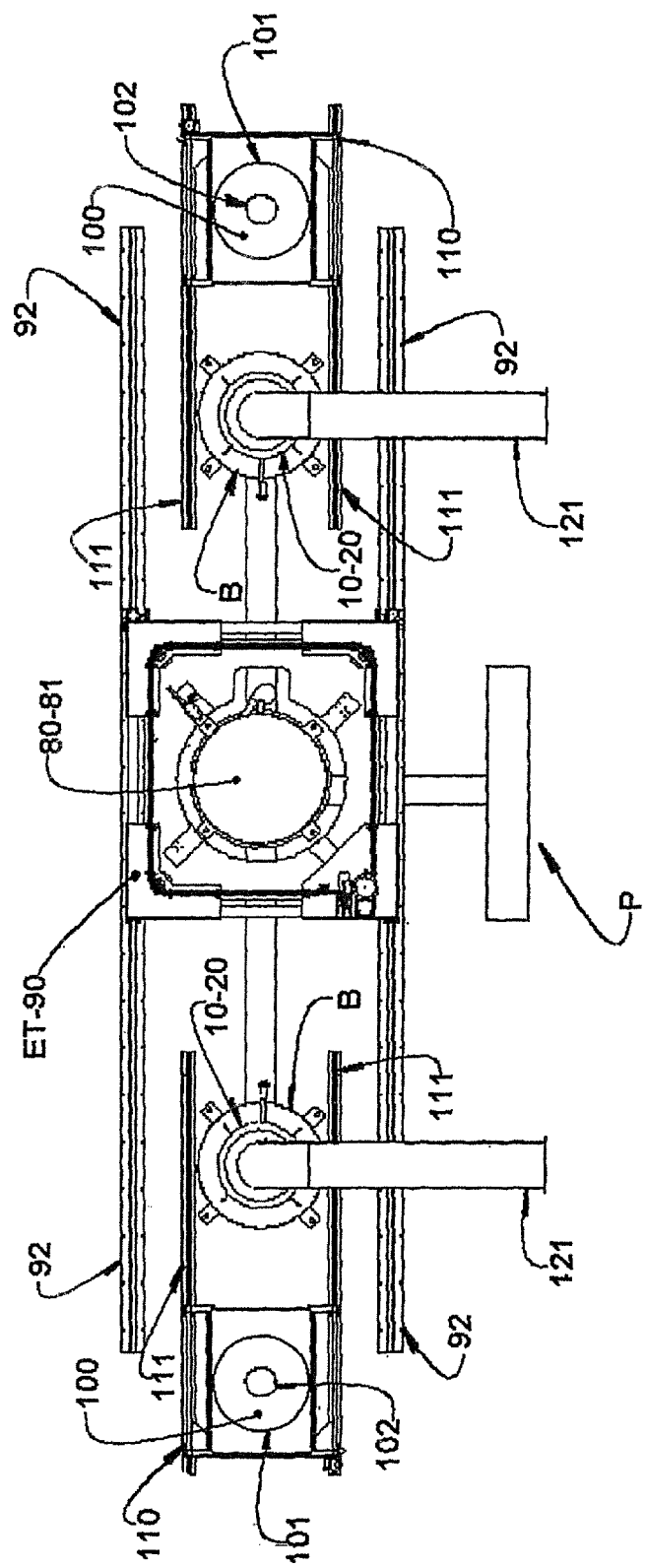
FIG. 7 represents a top plan view of the installation illustrated in FIG. 6.

In FIG. 5, both cooling devices 100 remain constantly connected to the shared exhaustion device 125 through respective suction ducts 121, in order to allow the displacement of each cooling device 100 between the inoperative and operative positions. In a distinct manner, in FIGS. 6 and 7 the suction ducts 121 are located vertically aligned with the reactors 10 in order to be engaged with the respective exhaustion conduits 102 of each cooling device 100, only when the latter is displaced to the operative position surrounding a respective reactor 10.

The invention described herein insofar is related to a treatment process, including at least one of the phases of cleaning L and surface treatment S of the metallic pieces 1, by means of the steps mentioned below.

The operation of the installation may start by carrying out a loading phase C of metallic pieces 1 into a first reactor 10, which is then subjected to a heating phase A by means of the heating device 80 selectively positioned around the first reactor 10, while its reaction chamber 23 is simultaneously fed with a load of ionizing gases provided by the source of ionizing gases 25 and subjected to an exhaustion of the gas load by the vacuum source 60 and also to electrical discharges provided by the electrical energy source 50, in order to carry out, in an operative time TO, at least one of the phases of cleaning L and surface treatment S.

Upon finishing the cleaning phase L and/or the surface treatment phase S, the heating device 80 is displaced away from the first reactor 10 and then is positioned over another reactor 10, already subjected to a loading phase C of new metallic pieces 1, subjecting said other reactor 10 to a heating phase A, by means of the heating device 80, while the reaction chamber 23 thereof is simultaneously fed with a load of ionizing gases provided by the source of ionizing gases 25 and subjected to an exhaustion of the gas load by the vacuum source 60 and also to electrical discharges provided by the electrical energy source 50.

Upon completion of the phases of cleaning L and/or surface treatment S of the first reactor 10, the latter may be subjected to the phases of cooling R, unloading D and loading C, during an inoperative time TI, preparing said first reactor 10 to receive, once more, the heating device 80, after finishing the cleaning phase L and/or surface treatment phase S in the other reactor 10.

As previously described, the present process also preferably uses an additional step of displacing the heating device 80 to a position spaced from the reactors 10, when the operative time TO of each reactor 10 is inferior to their inoperative time TI, before displacing said heating device 80 to surround the reactor 10 already loaded with a new load of metallic pieces 1.

According to the process, in the cooling phase R of each reactor 10, the latter is laterally and superiorly surrounded by a cooling device 100, when in an operative position. In an inoperative position, the cooling device 100 is spaced from the respective reactor 10.

As it may be observed from the disclosure above, the present installation and process may be applied for carrying out cleaning operations only in metallic pieces, for carrying out different thermal treatments in metallic pieces which require plasma treatments and also for carrying out a cleaning operation followed by a thermochemical treatment operation in the same reactor, without the need for cooling and removing from the latter the metallic pieces contained therein by the end of the cleaning operation.

When operating only in the cleaning of the metallic pieces, the process comprises the steps of:

a) connecting the support 30, supporting the metallic pieces 1, to the grounded anode and connecting the cathode of the anode-cathode system 40 to a negative potential of the electrical energy source 50;

b) surrounding the support 30 and the metallic pieces 1 with the ionizable gaseous charge fed to the reaction chamber 23 of the reactor 10;

c) heating the interior of the reaction chamber 23, during a heating phase A, from the outside of the reactor 10, to vaporization temperatures of the contaminants to be dissociated from the metallic pieces 1 under treatment inside the reaction chamber 23;

d) applying, to the cathode of the anode-cathode system 40, during the cleaning phase L of the pieces, an electrical discharge, in order to cause the formation of a gaseous plasma of ions with high kinetic energy, surrounding the metallic pieces 1 and the support 30, and a bombardment of electrons in the metallic pieces 1, to provide the molecular dissociation of the contaminants;

e) providing the exhaustion of the gas load and of the contaminants maintained in the gas state from the interior of the reaction chamber 23; and f) subjecting the reactor 10 to a cooling phase R and then to an unloading phase D of the clean metallic pieces 1, so that the reactor 10 may be subjected to a loading phase C of a new batch of pieces to be subjected to a cleaning phase L.

On the other hand, when operating only in the surface treatment phase S of the metallic pieces 1, the process comprises the steps of:

a) connecting the support 30, already loaded with the metallic pieces 1, to the cathode of the anode-cathode system 40 and connecting the anode to a negative potential of the electrical energy source 50;

b) surrounding the support 30 and the metallic pieces 1 with the ionizable gaseous charge fed to the reaction chamber;

c) heating, from the outside of the reactor 10, the interior of its reaction chamber 23, during a heating phase A, and keeping it heated at a required temperature for the desired thermochemical surface treatment;

d) applying to the cathode an electrical discharge, in order to provide the formation of a gaseous plasma of ions, surrounding the metallic pieces 1 and the support 30, and an ion bombardment in the metallic pieces 1;

e) provide the exhaustion of the gas load from the interior of the reaction chamber 23; and f) subjecting the reactor 10 to a cooling phase R and, subsequently, to an unloading phase D of the treated metallic pieces 1, so the reactor 10 may be subjected to a loading phase C of a new batch of pieces to be subjected to a surface treatment phase S.

As already mentioned, the installation and the process allow that the surface treatment operation of metallic pieces is carried out following the cleaning operation of said pieces, without having to remove them from the reactor, that is, without requiring the latter to be subjected to the phases of cooling, unloading of the clean pieces and loading of clean pieces to the same or to another reactor.

In such case, the surface treatment phase S is carried out following the cleaning phase L and comprises the additional steps of the surface treatment phase S of the metallic pieces 1, in the same reactor 10 not subjected to a cooling phase R by the end of the cleaning phase, said additional steps comprising:

f) maintaining, also from the outside of the reactor and in a new heating phase A, the interior of the reaction chamber 23 thereof at a temperature required for the desired thermochemical surface treatment;

g) inverting the energizing polarity of the anode-cathode system 40, so that the support 30, with the metallic pieces 1, defines the cathode;

h) surrounding the support 30 and the metallic pieces 1 with a new ionizable gaseous charge fed to the reaction chamber 23;

i) applying to the cathode an electrical discharge, in order to provide the formation of a gaseous plasma of ions, surrounding the metallic pieces 1 and the support 30, and an ion bombardment in the metallic pieces 1;

j) provide the exhaustion of the gas load from the interior of the reaction chamber 23; and k) subjecting the reactor 10 to a cooling phase R and then to an unloading phase D of the treated metallic pieces 1, so the reactor 10 may be subjected to a loading phase C of a new batch of pieces to be subjected to the cleaning phase L and surface treatment phase S.

It should be understood that alterations can be made in the form and arrangement of the constitutive elements, without departing from the constructive concept defined in the claims that accompany the present specification.

The invention claimed is:

1. An installation for the treatment of metallic pieces by a plasma reactor of the type comprising a metallic housing (20) defining, internally, a reaction chamber (23) provided with: a support (30); an anode-cathode system (40) connectable to an electrical energy source (50); an inlet (21) connectable to a source of ionizable gases (25); an outlet (22) for gaseous charge exhaustion, connectable to a vacuum source (60); and a heating device (80) for heating the reaction chamber (23), said reactor (10) being subjected to the heating phase (A), cleaning phase (L) and/or surface treatment phase (S), cooling phase (R), unloading phase (D) and loading phase (C) of metallic pieces (1), the installation being characterized in that it comprises: at least two reactors (10), each having, selectively and alternately: the inlet (21) thereof connected to the same source of ionizable gases (25); the outlet (22) thereof connected to the same vacuum source (60); and the anode-cathode system (40) thereof connected to the same electrical energy source (50), the heating device (80) being displaceable between operative positions, in each of which the latter surrounds, laterally and superiorly, a respective reactor (10) of the installation, while said reactor (10) is in the heating phase (A) and cleaning phase (L) and/or surface treatment phase (S) of the metallic pieces (1).

2. The installation, as set forth in claim 1, characterized in that the heating device (80) is maintained in an operative position, surrounding a respective first reactor (10), for a time corresponding to N times the time in which any other reactor (10) of the installation takes to complete its cooling phase (R), discharge phase (D) and loading phase (C), N being an integer at least equal to 1 and the number of reactors (10) of the installation being defined by N+1.

3. The installation, as set forth in claim 1, characterized in that the heating device (80) is maintained in an operative position, surrounding a respective first reactor (10), during the heating phase (A) and cleaning phase (L) and/or the surface treatment phase (S), for a time greater than the sum of the times which the other reactor (10) of the installation takes to complete its cooling phase (R), unloading phase (D) and loading phase (C), but inferior to twice said sum, the difference between the time in operative position and said sum defining a reactor waiting time (TER) in which said other reactor (10) finishes its loading phase (C) before the first reactor (10) finishes its cleaning phase (L) and/or surface treatment phase (S).

4. The installation, as set forth in claim 1, characterized in that the heating device (80) is maintained in an operative position, surrounding a respective first reactor (10), during the heating phase (A) and cleaning phase (L) and/or de surface treatment phase (S), for a time inferior to the sum of the times which another reactor (10) of the installation takes to complete its cooling phase (R), unloading phase (D) and loading phase (C) superior to half of said sum of times, the difference between the time in the operative position and said sum of times defining a heater waiting time (TEA) in which the heating device (80) and the source of ionizable gases (25), vacuum source (60) and electrical energy source (50) remain inoperative while waiting for the end of the loading phase (C) of the first reactor (10).

5. The installation, as set forth in claim 2, characterized in that each of the reactors (10) have: the inlet (21) thereof connectable to the source of ionizable gases (25) by means of respective conduits (26) and of a common conduit (28), each of the conduits (26) being provided with a control valve (27); the outlet (22) thereof being connectable to the vacuum source (60) by means of respective ducts (61) and of a common duct (63), each of the ducts (61) being provided with a shut off valve (62); and the anode-cathode system (40) thereof being selectively connectable to the electrical energy source (50) by means of a switch system (70), in order to selectively and alternately power each of the reactors (10) of the installation.

6. The installation, as set forth in claim 5, characterized in that the switch system (70) provides a polarity inversion between the anode and the cathode of the anode-cathode system (40) of each reactor (10) upon changing from one of the cleaning phase (L) and of surface treatment phase (S) to another of said operations to be carried out inside the same reactor (10).

7. The installation, as set forth in claim 6, characterized in that it further comprises a control panel (P) operatively associated with both the control valve (27) and the shut off valve (62) and with the switch system (70), controlling their selective operation.

8. The installation, as set forth in claim 1, characterized in that the heating device (80) comprises an outer shell (81), which surrounds it laterally and superiorly and defines a heating chamber (82) inside which is contained and affixed the heating device (80), the latter being displaceable, selectively and vertically, between an operative lowered position, in which it is positioned around a respective reactor (10), and a raised position, displaced upwards from the respective reactor (10), the heating device (80) further being displaceable from the raised position to a position in vertical alignment over any other reactor (10) of the installation, to be vertically displaced to a new operative lowered position, in which it surrounds said other reactor (10).

9. The installation, as set forth in claim 8, characterized in that it further comprises an elevation and translatory means (ET) defined by a car (90) in the form of a structural frame displaceable on a pair of rails (92) located between two reactors (10), said car (90) carrying an elevation device (91) in which is mounted the heating device (80).

10. The installation, as set forth in claim 1, characterized in that it further comprises a cooling device (100) to be selectively applied to a reactor (10), upon finishing the cleaning phase (L) and/or the surface treatment phase (S) in said reactor (10).

11. The installation, as set forth in claim 10, characterized in that it comprises one cooling device (100) for each reactor (10), each cooling device (100) comprising a tubular housing (101) inferiorly open, superiorly closed and provided with an exhaustion conduit (102) to be connected to an exhaustion system (120), provided with suction ducts (121), each to be coupled to one of the exhaustion conduits (102) of a respective cooling device (100), said suction ducts (121) being connected, by means of respective exhaustion valves (122), to a common exhaustion device (125), said exhaustion valves (122) being operatively associated with a control panel (P).

12. The installation, as set forth in claim 10, characterized in that each cooling device (100) is mounted on a movable frame (110), which can slide on a pair of rails (111), providing the displacement of each cooling device (100) between an inoperative position, away from the respective reactor (10), and an operative position, surrounding laterally and superiorly said reactor (10).

13. A process for the treatment of metallic pieces by a plasma reactor of the type defined in claim 1, characterized in that it comprises the steps of:
carrying out a loading phase (C) of metallic pieces (1) into a first reactor (10);
subjecting the first reactor (10) to a heating phase (A) by means of a heating device (80) selectively positioned around the first reactor (10), while the reaction chamber (23) thereof is simultaneously fed with a load of ionizing gases provided by the source of ionizing gases (25) and subjected to an exhaustion of the gas load by the vacuum source (60) and to electrical discharges provided by the electrical energy source (50), to carry out, during an operative time (TO), at least one of the cleaning phase (L) and surface treatment phase (S) of the metallic pieces (1);
displacing the heating device (80) away from the first reactor (10) and then positioning the former over another reactor (10) already subjected to a loading phase (C) of new metallic pieces (1), subjecting said other reactor (10) to a heating phase (A) by means of the heating device (80), while the reaction chamber (23) thereof is simultaneously fed with a load of ionizing gases provided by the source of ionizing gases

(25) and subjected to an exhaustion of the gas load by the vacuum source (60) and to electrical discharges provided by the electrical energy source (50); and subjecting the first reactor (10) to the phases of cooling (R), unloading (D) and loading (C), during an inoperative time (TI), preparing said first reactor (10) to receive once again the heating device (80), after finishing the cleaning phase (L) and/or surface treatment phase (S) in the other reactor (10).

14. The process, as set forth in claim 13, characterized in that it includes an additional step of displacing the heating device (80) to a position away from the reactors (10), when the operative time (TO) of each said reactor (10) is inferior to the inoperative time (TI) thereof, before displacing said heating device (80) to surround the reactor (10) already loaded with a new batch of metallic pieces (1).

15. The process, as set forth in claim 14, characterized in that in the cooling phase (R) of each reactor (10), the latter is laterally and superiorly surrounded by a cooling device (100), when in an operative position, and in an inoperative position the cooling device (100) is spaced away from the respective reactor (10).

16. The process, as set forth in claim 13, characterized in that the cleaning phase (L) of the metallic pieces (1) comprises the steps of:

connecting the support (30), already supporting the metallic pieces (1), to the grounded anode and connecting the cathode of the anode-cathode system (40) to a negative potential of the electrical energy source (50);

surrounding the support (30) and the metallic pieces (1) with the ionizable gaseous charge fed to the reaction chamber (23);

heating the interior of the reaction chamber (23), from the outside of the reactor (10), to vaporization temperatures of the contaminants to be dissociated from the metallic pieces (1) under treatment inside the reaction chamber (23);

applying, to the cathode of the anode-cathode system (40), an electrical discharge, in order to cause the formation of a gaseous plasma of ions with high kinetic energy, surrounding the metallic pieces (1) and the support (30), and a bombardment of electrons in the metallic pieces (1), to provide the molecular dissociation of the contaminants;

providing the exhaustion of the gas load and of the contaminants maintained in the gas state, from the interior of the reaction chamber (23); and subjecting the reactor (10) to a cooling phase (R) and then to an unloading phase (D) of the metallic pieces (1).

17. The process, as set forth in claim 16, characterized in that the surface treatment phase (S) is carried out in the same reactor (10), following the cleaning phase (L) and before the cooling phase (R), comprising the additional steps of:

maintaining, also from the outside of the reactor (10) and in a new heating phase (A), the interior of the reaction chamber (23) thereof at a temperature required for the desired surface treatment;

inverting the energizing polarity of the anode-cathode system (40), so that the support (30) defines, with the metallic pieces (1), the cathode;

surrounding the support (30) and the metallic pieces (1) with a new ionizable gaseous charge fed to the reaction chamber (23);

applying to the cathode an electrical discharge, in order to provide the formation of a gaseous plasma of ions, surrounding the metallic pieces (1) and the support (30), and an ion bombardment in the metallic pieces (1);

providing the exhaustion of the new gas load from the interior of the reaction chamber (23); and subjecting the reactor (10) to said cooling phase (R) and then to an unloading phase (D) of the treated metallic pieces (1).

18. The process, as set forth in claim 13, characterized in that the surface treatment phase (S) of the metallic pieces (1) comprises the steps of:

connecting the support (30), already loaded with the metallic pieces (1), to the cathode of the anode-cathode system (40) and connecting the anode to a negative potential of the electrical energy source (50);

surrounding the support (30) and the metallic pieces (1) with the ionizable gaseous charge fed to the reaction chamber (23);

heating, from the outside of the reactor (10), the interior of the reaction chamber (23) thereof, during a heating phase (A), and keeping it heated to a required temperature for the desired surface treatment;

applying to the cathode an electrical discharge, in order to provide the formation of a gaseous plasma of ions, surrounding the metallic pieces (1) and the support (30), and an ion bombardment in the metallic pieces (1);

providing the exhaustion of the gas load from the interior of the reaction chamber (23); and subjecting the reactor (10) to a cooling phase (R) and then to an unloading phase (D) of the treated metallic pieces (1), so that the reactor (10) may be subjected to a loading phase (C) of a new batch of pieces to be subjected to a surface treatment phase (S).

\* \* \* \* \*